US011163480B2

(12) United States Patent
Madraswala et al.

(10) Patent No.: US 11,163,480 B2
(45) Date of Patent: Nov. 2, 2021

(54) METHOD AND APPARATUS FOR PERFORMING AN ERASE OPERATION COMPRISING A SEQUENCE OF MICRO-PULSES IN A MEMORY DEVICE

(71) Applicant: Intel Corporation, Santa Clara, CA (US)

(72) Inventors: Aliasgar S. Madraswala, Folsom, CA (US); Kristopher H. Gaewsky, El Dorado Hills, CA (US); Siddhanth Munukutla, Folsom, CA (US); Tanya Wanchoo, San Jose, CA (US); Heonwook Kim, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/777,812

(22) Filed: Jan. 30, 2020

(65) Prior Publication Data

US 2021/0240380 A1 Aug. 5, 2021

(51) Int. Cl.
*G06F 3/06* (2006.01)
*G11C 16/14* (2006.01)
*G11C 16/04* (2006.01)

(52) U.S. Cl.
CPC .......... *G06F 3/0652* (2013.01); *G06F 3/0604* (2013.01); *G06F 3/0659* (2013.01); *G06F 3/0679* (2013.01); *G11C 16/14* (2013.01); *G11C 16/0483* (2013.01)

(58) Field of Classification Search
CPC .... G06F 3/0652; G06F 3/0659; G06F 3/0604; G06F 3/0679; G11C 16/14; G11C 16/0483
USPC ........................................................ 711/103
See application file for complete search history.

(56) References Cited

U.S. PATENT DOCUMENTS

| | | | |
|---|---|---|---|
| 2019/0392910 A1* | 12/2019 | Lee ..................... | G11C 16/3459 |
| 2020/0135277 A1* | 4/2020 | Luo ..................... | G11C 11/5635 |
| 2021/0019609 A1* | 1/2021 | Strukov ................. | G06N 3/049 |
| 2021/0035642 A1* | 2/2021 | Rayaprolu ........... | G11C 16/349 |
| 2021/0065802 A1* | 3/2021 | Rabkin .............. | G11C 16/0483 |
| 2021/0082908 A1* | 3/2021 | Nakai ................. | H01L 27/0296 |

* cited by examiner

*Primary Examiner* — Fernando Hidalgo
(74) *Attorney, Agent, or Firm* — Schwabe, Williamson & Wyatt, P.C.

(57) ABSTRACT

Embodiments of the present disclosure are directed towards techniques and configurations for a memory apparatus configured with an erase command comprising a sequence of segments. In one embodiment, the memory apparatus is configured to generate an erase command in response to a request provided by a host to erase at least a portion of data stored in a memory device. The erase command comprises a sequence of erase segments that provide an erase voltage for erasing the portion of data stored in the memory apparatus. The memory apparatus is configured to grant access to the memory apparatus for servicing the memory access requests initiated by the host, during a time period between at least two adjacent erase segments in the sequence. Other embodiments may be described and/or claimed.

9 Claims, 7 Drawing Sheets

METHOD AND APPARATUS FOR PERFORMING AN ERASE OPERATION COMPRISING A SEQUENCE OF MICRO-PULSES IN A MEMORY DEVICE

FIELD

Embodiments of the present disclosure generally relate to the field of memory devices, and more particularly, to techniques for performing an erase operation in a non-volatile memory device.

BACKGROUND

Electronic storage devices include non-volatile memory (NVM) devices, such as a NAND flash device or NOR flash device that includes an array of memory elements. Each memory element is configured to store a charge, voltage, or other electrical parameter to represent the data.

In some instances, an erase operation may be performed on NVM devices. An erase operation includes any operation to erase a data value represented by a persisted state on the NVM. The erase operation is initiated by an erase command. The erase command typically includes an erase pulse generated by the memory controller and provided to the NVM device in order to erase the memory cells of a target memory block (or blocks) to be erased in the memory cell array.

An erase suspend or erase auto suspend (EAS) operation may be performed on an NVM (e.g., NAND, such as 3D NAND, or NOR) device to suspend an erase operation to a given block of memory elements, in order to allow one or more other memory access operations (e.g., read, write/program, etc.) to be processed at the NVM while the erase operation is suspended. An erase step corresponding to the current erase operation may be stored before suspending the erase operation. The erase operation may be resumed at the stored erase step after the memory access request has been (at least partly) completed.

In an EAS operation, if a suspend occurs during the erase pulse duration, the NVM device waits for the completion of the erase pulse and then performs the suspend command. Accordingly, the memory system's quality of service (QoS) performance is limited by the erase pulse time, which in some embodiments, may comprise approximately 1.2-1.6 milliseconds.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
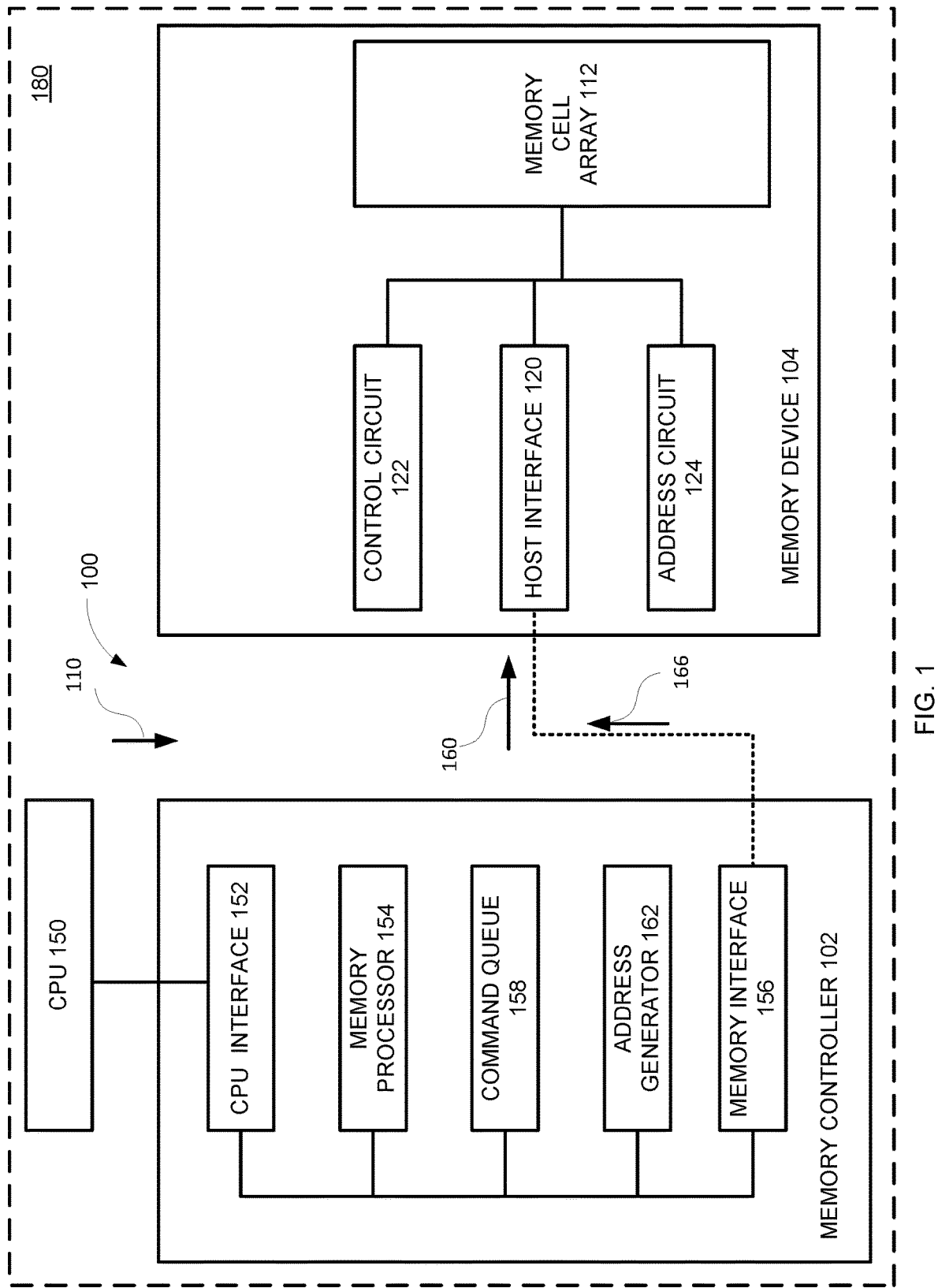
FIG. 1 illustrates an example memory apparatus in a computing apparatus, in accordance with some embodiments.

Embodiments of the present disclosure describe techniques and configurations for a memory apparatus of a computing device configured with an erase command comprising a sequence of segments (e.g., micro-pulses). In embodiments, the memory apparatus is configured to generate an erase command in response to a request provided by a host of the computing device to erase at least a portion of data stored in a memory device. The erase command comprises a sequence of erase segments that provide an erase voltage for erasing the portion of data stored in the memory apparatus. A duration of an erase segment is less than a duration of a conventional erase pulse. The memory apparatus is configured to grant access to the memory apparatus if necessary, e.g., for servicing memory access requests initiated by the host, during a time period between at least two adjacent erase segments in the sequence. In embodiments, the memory apparatus may comprise a flash memory device, such as a 3D NAND. In embodiments, the memory apparatus may include a memory controller to operate the erase command and memory access requests in the memory apparatus.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 illustrates an example memory apparatus, to be operated in a computing device, in accordance with some embodiments. Specifically, memory apparatus 100 includes a memory controller 102 coupled with a memory device 104 that may be used to perform erase operations in accordance with embodiments described herein. The memory controller 102 may be coupled in circuit with the memory device 104 via one or more buses such as a data bus, an address bus and/or control signals. The memory controller 102 of the illustrated example is configured to control memory operations performed by the memory device 104. For example, the memory controller 102 can receive memory access requests 110 (including erase requests) from a host processor (central processing unit (CPU)) 150 of a computing device 180 shown in dashed lines, coupled with the memory controller 102 via a CPU interface 152. In embodiments, the memory controller 102 may be integrated with the CPU 150 in a system on chip (SoC).

The memory controller 102 is configured to send commands to the memory device 104 to cause the memory device 104 to perform memory operations such as read operations, write operations, erase operations, etc. In addition, the memory controller 102 may send information to be written to the memory device 104 and receive information read from the memory device 104, and provide the received information to the CPU 150. The memory device 104 is configured to store information, such as data and/or computing instructions, in a memory cell array 112. The memory device 104 may be any type of memory device suitable for implementing examples disclosed herein. In embodiments, the memory device 104 may comprise a NVM device, such as a NAND (e.g., 3D NAND) flash device, a NOR flash device, or the like.

In embodiments, the memory controller 102 includes a memory processor 154, configured to control the operations of the memory controller 102, such as memory access requests, including erase requests provided by the CPU 150. The memory processor 154 may be configured to enable the EAS feature to suspend the erase operation after completion of an erase segment in an erase sequence in accordance with embodiments described herein, in order to service a memory access request (or requests, e.g., read or write) provided by the CPU 150.

More specifically, the memory processor 154 may be configured to process memory access requests 110 initiated by the CPU 150, including a request to erase at least a portion of data from the memory device 104, e.g., from the memory cell array 112. The memory processor 154 is further configured to generate an erase command 160 associated with the erase request, or other commands 166 associated with memory access requests provided by the CPU 150.

In embodiments, the erase command 160 includes a sequence of erase segments (micro-pulses), with time periods between adjacent erase segments. In embodiments, the erase segments may comprise micro-pulses of a certain duration that provide a voltage value necessary for implementation of the erase command on the memory device 104. The erase segment duration value is a time period during which the micro-pulse provides the erase voltage value to the memory cell array 112. Duration of a segment in a sequence equals a predetermined time period that is less than a time period allocated for the performance of the erase command (erase pulse) by the memory device 104 in conventional solutions.

In embodiments, the memory controller 102 includes a memory interface 156 coupled with the memory processor 154 and configured to interface and communicate with the memory device 104, including providing the erase command 160 to the memory device 104. In embodiments, the memory interface 156 may include an address bus, a data bus, and/or requisite control signals. In embodiments, the memory interface 156 may be configured to provide the erase command 160 comprising the erase segments to the memory device 104, or cause the memory device 104 (e.g., control circuit 122 of the memory device 104) to generate the erase segments corresponding to the erase command. For example, the memory processor 154 can be configured to program the memory device 104 to perform an erase operation as a sequence of erase segments (micro-pulses) provided to the memory cell array 112, in accordance with embodiments described herein. The memory device 104 is configured to execute an erase operation associated with the erase command 160, to erase the requested portion of data.

In embodiments, the memory controller 102 includes a command queue 158, to store memory operation commands to be sent by the memory controller 102 to the memory device 104. For example, the memory controller 102 may receive memory access requests 110 from the CPU processor 150, and store corresponding memory operation commands 166 in the command queue 158.

In embodiments, the memory controller 102 includes an address generator 162, to generate physical addresses of the memory device 104 corresponding to the memory access requests received from the CPU 150. For example, the address generator 162 may generate physical addresses for read requests, write requests, erase requests, etc.

In embodiments, the memory controller 102 is configured to suspend (auto-suspend) the erase operation and grant access to the memory device 104 for memory access requests 110 provided by the CPU 150, during the time periods between the adjacent erase segments (micro-pulses) of the erase command 160.

For example, after the memory controller 102 programs the memory device 104 to enable the erase auto suspend feature, the memory controller 102 may initiate an erase operation to be performed at the memory device 104. For example, the memory controller 102 may receive an erase request from the CPU 150 requesting a specified address or address range to be erased, and may send a corresponding erase command 160 to the memory device 104. In response to receiving the erase command from the memory controller 102, the memory device 104 performs an erase operation.

For example, the memory device 104 can perform the erase operation as a plurality of erase segments having durations equal to the erase segment duration value and suspend the erase operation between at least some of the erase segments, in order to provide an opportunity for fulfilment of memory access requests during a time period (or periods) between the erase segments. After performing a portion of the erase operation during a first erase segment, the memory device 104 suspends the erase operation on a memory block being erased (e.g., a suspended memory block), upon completion of the erase segment. When the erase operation is suspended, the memory controller 102 initiates another memory operation to be performed at the memory device 104. For example, the memory controller 102 may receive an access (e.g., read) request 110 from the CPU 150, and send a corresponding read command 166 to the memory device 104 while the erase operation is suspended.

In embodiments, the memory device 104 includes a host interface 120, to communicatively couple the memory device 104 to the memory controller 102, such as via the memory interface 156. The memory device 104 further includes a control circuit 122 to control operations of the memory device 104. For example, the control circuit 122 may be configured to generate one or more (e.g., a sequence of) erase segments (micro-pulses) to erase the target memory cells of a target memory block to be erased in the memory cell array 112, in response to the erase command 160 provided by the memory controller 102. The control circuit 122 may also be configured to control an erase verify operation performed on the target memory cells to verify that the erase micro-pulses successfully erased the target memory cells.

The description of the memory apparatus 100 is not limiting to the components described above. In embodiments, the memory apparatus 100 may include other components. For example, the memory device 104 may include an address circuit 124, to decode physical addresses provided by the memory controller 102 into column addresses and row addresses of memory cells in the memory cell array 112. The memory device 104 may also include a status register (not shown) to store status information of the memory device 104; and a timing circuit (not shown) to track elapsed lengths of time during the erase operation, to facilitate the EAS feature; and the other components.

After the memory controller 102 determines that the other memory operation is complete, the memory controller 102 initiates resumption of the erase operation. For example, the memory controller 102 may send another erase command 160 to the memory device 104 to resume the erase operation. In embodiments, the memory device 104 may resume the erase operation by proceeding to continue erasing the same memory block that was previously suspended (e.g., the suspended memory block).

Figure 2:
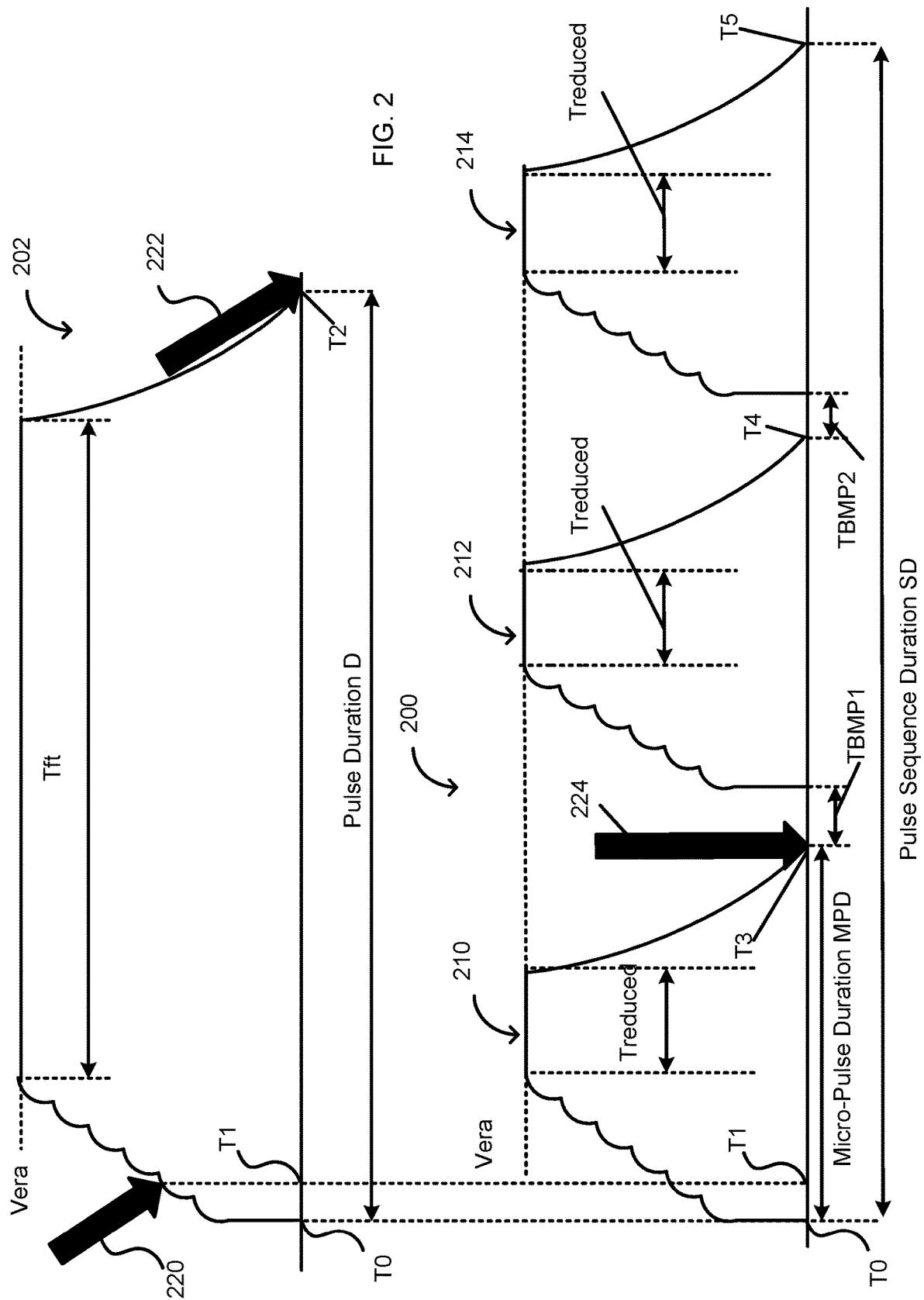
FIG. 2 is a diagram illustrating an example sequence of erase segments used in an erase command, in accordance with some embodiments.

FIG. 2 is a diagram illustrating an example sequence of erase segments generated or caused to be generated by an erase command, in accordance with some embodiments. It will be understood that the erase command initiates a corresponding erase voltage (conventional pulse 202 or erase sequence of micro-pulses 200) in the memory device 104.

The example erase sequence 200 comprising a series of segments (micro-pulses) 210, 212, and 214 is shown in comparison with the conventional erase segment (pulse) 202, utilized in conventional solutions, for purposes of explanation. For ease of understanding, the sequence 200 is shown as including three micro-pulses 210, 212, and 214. However, it is to be understood that any number of segments (micro-pulses) may be used in an erase sequence. As shown, both conventional erase pulse 202 and the erase sequence 200 provide the desired erase voltage Vera to the memory device 104.

The conventional erase pulse 202 may have a total pulse duration D, and the sequence 200 may have a total pulse sequence duration SD. In embodiments, SD is equal to or greater than D. Accordingly, the micro-pulse duration MPD (shown in segment 210) is shorter than D (and SD).

In embodiments, while maintaining the same erase voltage Vera, the erase sequence of segments (micro-pulses) 200 may comprise micro-pulses 210, 212, 214 each having duration MPD, which is shorter than conventional pulse duration D. Similarly, the time period Treduced, during which the micro-pulses provide flat top erase voltage Vera, is shorter than the total flat top time Tft of the conventional erase pulse 202. Accordingly, the memory apparatus 100 may perform other operations (e.g., fulfilling memory access requests provided by CPU 150) in the time periods TBMP1, TBMP2 between the micro-pulses 210 and 212, and 212 and 214.

Assume both conventional erase pulse 202 and the erase sequence 200 have the same initiation time T0, as shown in FIG. 2. Assume further that a memory access request 220 comes in from the CPU 150 at a time T1 (shown in diagrams 202 and 200).

In current solutions, in order to attend to the request, the memory device 104 would have to wait for the erase segment (conventional erase pulse 202) to complete at a time T2, and then suspend the corresponding erase operation in order to fulfill the request. In other words, the memory device 104 would wait for the time T2−T1 (or D−(T1−T0)), until the erase segment (conventional erase pulse 202) and a corresponding portion of the erase operation completed, and then suspend (indicated by arrow 222) the erase command corresponding to the erase pulse 202 at a time T2, in order to attend to the memory access request 220.

In contrast, in embodiments described herein, in order to attend to the memory access request 220, the memory device 104 would have to wait only until for the erase segment 210 of the sequence 200 completes. In other words, the memory device 104 would wait for the time T3−T1 (or MPD−(T1−T0)), where MPD is a micro-pulse duration of the segment 210, until the erase segment 210 and a corresponding portion of the erase operation is completed, and then suspend (224) the erase command at a time T3, and attend to the memory access request 220. As shown, the erase command (and corresponding sequence 200) may be suspended for the time period TBMP1 between segments (micro-pulses) 210 and 212, and at least a portion of the memory access request may be fulfilled. Similarly, the erase command (and corresponding sequence 200) may be further suspended at times T4 and T5, and the memory access request (or requests) may be attended to during the respective time period TBMP2 (and during other respective suspension time periods if the sequence 200 includes more than three micro-pulses 210, 212, and 214). In embodiments, the time periods TBMP1 and TBMP2 may be flexible. In other words, these time periods may modulate, based on other operations performed by the memory device.

In embodiments, micro-pulse duration MPD can amount to approximately 50% of the pulse duration D of the conventional erase command (conventional erase pulse 202). Thus, in the described embodiments, the total time reduction for suspension of an erase command can be about 50% of the total time allocated for an erase command. For example, a conventional erase pulse time can be about 1.2-1.5 milliseconds. In embodiments described herein, the micro-pulse duration MPD can amount to above 850 microseconds.

In summary, an erase operation associated with the erase command can be suspended, and access to the memory device 104 can be granted at a time T3 corresponding to a completion of a first erase segment 210 of the two adjacent erase segments (e.g., 210 and 212). Similarly, the erase operation may be suspended, and access to the memory device 104 may be granted between segments 212 and 214, and so on, as necessary for completion of the memory access request.

The embodiments described herein provide for utilization of the time periods between the erase micro-pulses for high-priority operations (e.g., servicing memory access requests), which leads to a better system QoS. Also, the embodiments described herein improve the erase pulse time by about 50%, which also results in improved system QoS. The detection of high-priority operations may be detected, for example, by polling for "busy time" and monitoring "busy time" (e.g., time periods between the erase micro-pulses). Further, erase suspend time may change (e.g., increase) using the embodiments described herein. Accordingly, the changed erase suspend time can also be monitored in order to detect the high-priority operations during the suspended erase command.

As noted above, a number of micro-pulses in an erase sequence according to embodiments described herein may not be limited to three micro-pulses shown in FIG. 2. In embodiments, the number of micro-pulses in an erase sequence (e.g., 200) may be determined by comparing the performance of the erase sequence in erasing memory cells of the memory device 104, with performance of a conventional erase pulse (e.g., 202).

Figure 3:
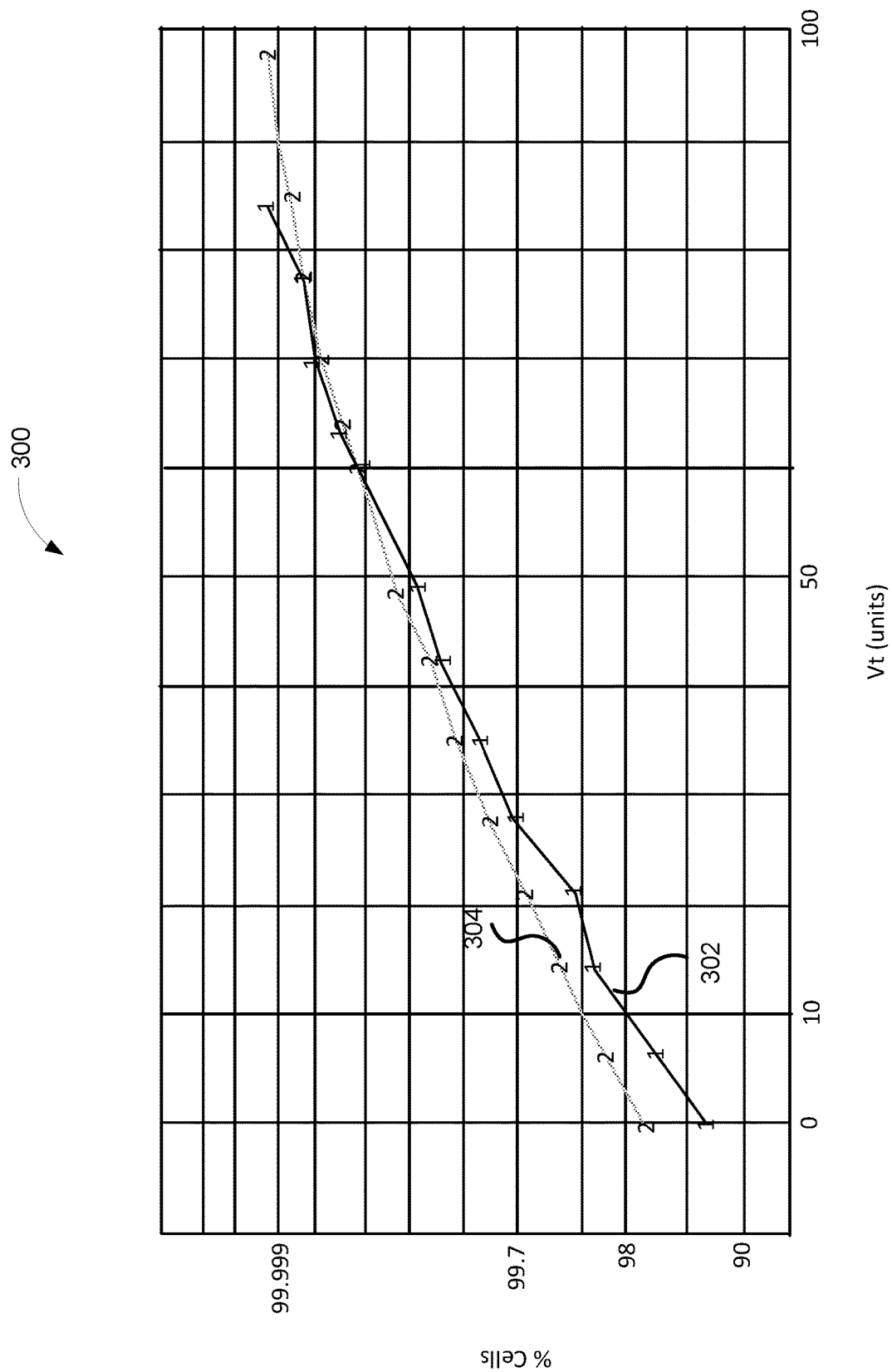
FIG. 3 is an example graph illustrating threshold voltage Vt curves resulting from the use of a conventional erase pulse and a sequence of micro-pulses, in accordance with some embodiments.

FIG. 3 is an example graph illustrating threshold voltage Vt curves resulting from the use of a conventional erase pulse and a sequence of micro-pulses, in accordance with some embodiments. It is to be understood that Vt represents a threshold voltage for changing a state of a transistor, and is typically used as a metric of reference for memory devices.

In graph 300, the curve 302 shows a percentage of erased memory cells in the memory device (e.g., 104) as a function of the threshold voltage Vt, using a conventional erase pulse (e.g., 202). The curve 304 represents a percentage of erased memory cells in the same memory device as a function of the threshold voltage Vt, using a sequence of micro-pulses. As shown, for a particular example memory device, the sequence of micro-pulses provides fairly similar (or substantially similar) performance compared to the conventional erase pulse. As can be seen in FIG. 3, the example curve 304 substantially replicates the example curve 302, wherein the number of micro-pulses in the erase sequence of the erase command is eight pulses. In general, the use of the sequence of micro-pulses in a flash memory device provides for a Vt curve that is substantially similar to the Vt curve that results from using a conventional erase pulse.

In the example illustrated in FIG. 3, almost all (e.g., about 99.9%) of cells are erased by a conventional erase pulse and are erased by the sequence of eight micro-pulses at Vt having approximately equal values (e.g., 90-95 voltage units).

In the illustrated example, a micro-pulse of the erase sequence of micro-pulses has an erase time of about half the time of the conventional erase pulse at the same erase voltage (e.g., Vera=20 V). Accordingly, for the illustrated example, the time saving corresponds to about 50% reduction in pulse time.

Figure 4:
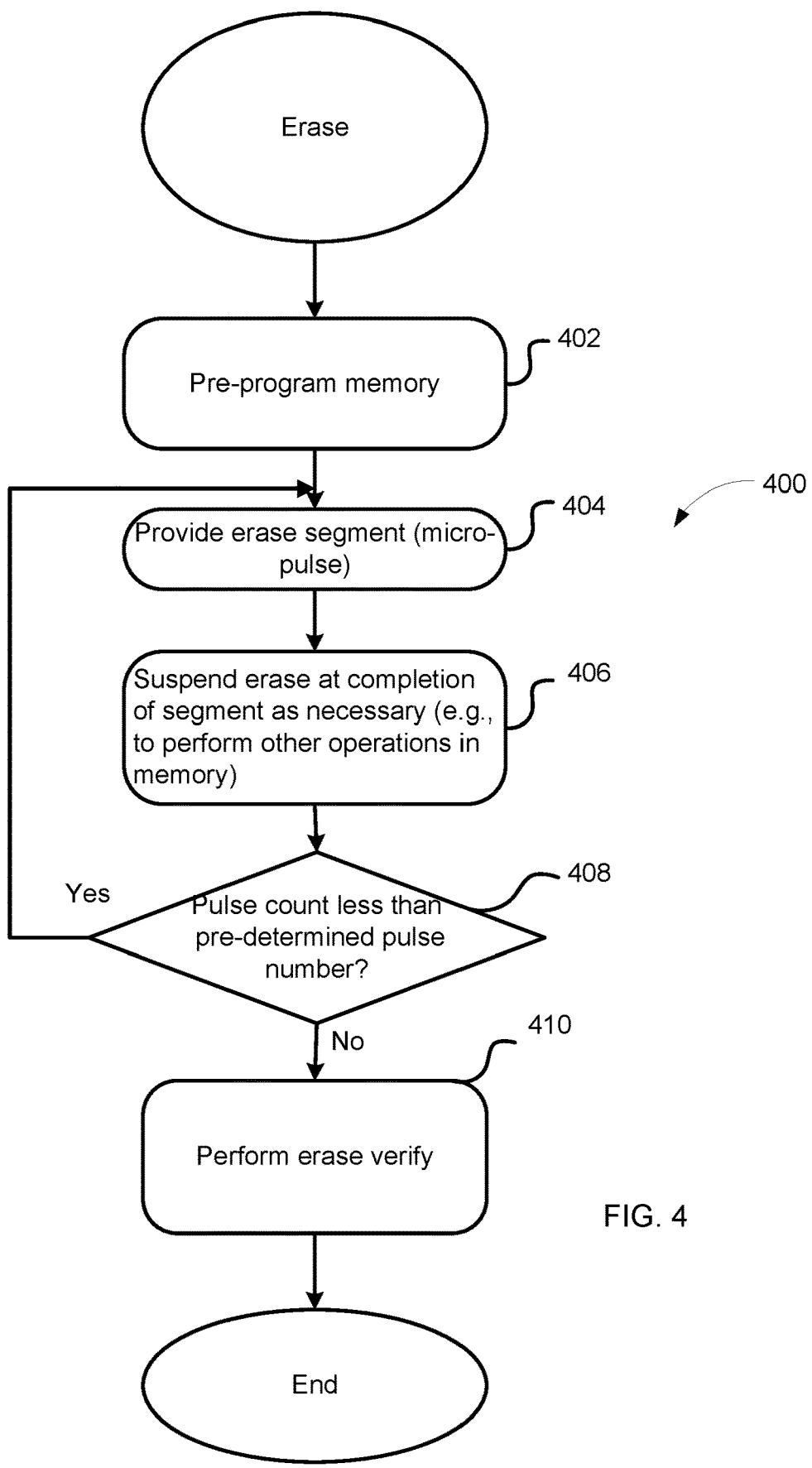
FIG. 4 is an example process flow diagram for providing an erase sequence of micro-pulses in a memory device, in accordance with some embodiments.

It is to be understood that the number of micro-pulses in an erase sequence according to the embodiments described herein may vary depending on a type of a memory device, memory volume, and other technical parameters. FIG. 4 is an example process flow diagram for providing an erase sequence of micro-pulses in a memory device, in accordance with some embodiments. The process 400 may comport with actions described in connection with FIGS. 1-2 in some embodiments. For example, in embodiments, the process 400 may be performed by the memory apparatus 100 of FIG. 1, e.g., memory controller 102 operating with the memory device 104. In embodiments the process 400 may be implemented as firmware, executable software, or a combination thereof.

At block 402, the process 400 includes pre-programming the memory device (e.g., memory cell array 112 of the memory device 104). For example, a particular voltage may be applied to the memory array to pre-program memory cells.

At block 404, the process 400 includes providing an erase micro-pulse (e.g., applying the micro-pulse to the memory cell array 112).

At block 406, the process 400 includes suspending an erase operation upon completion of the micro-pulse, as necessary. For example, as described above, the erase operation may be suspended between adjacent micro-pulses to perform other operations on the memory device 104, such as servicing memory access requests provided by the CPU 150 to the memory apparatus 100.

At decision block 408, the process 400 includes determining whether the micro-pulse count reached a predetermined total number of micro-pulses. As described above, the number of micro-pulses may vary from memory device to memory device and may be determined empirically, based on the histogram shown in FIG. 3.

If the total number of micro-pulses has not been reached, the process 400 returns to block 404, at which another micro-pulse is initiated and applied to the memory cell array 112. If the total number of micro-pulses has been reached, the process 400 moves to block 410.

At block 410, the process 400 includes performing an erase verify operation, e.g., verifying that the desired number of memory cells (or memory blocks) has been erased.

The operations of the process 400 are described as multiple discrete operations, in a manner that is most helpful in understanding the claimed subject matter. It will be appreciated that the sequence of operations associated with the process 400 may vary and/or include other actions in accordance with the present disclosure.

As known, a memory device has a lifecycle, during which multiple memory access operations are performed on the memory cells of the device multiple times and in different conditions (e.g., different ambient temperatures).

The memory devices and methods described herein may be implemented into a system using any suitable hardware and/or software to configure as desired. Accordingly, the "wear and tear" of a memory device may affect its performance, particularly at the end of its lifespan ("end of life"), due to natural degradation.

Figure 5:
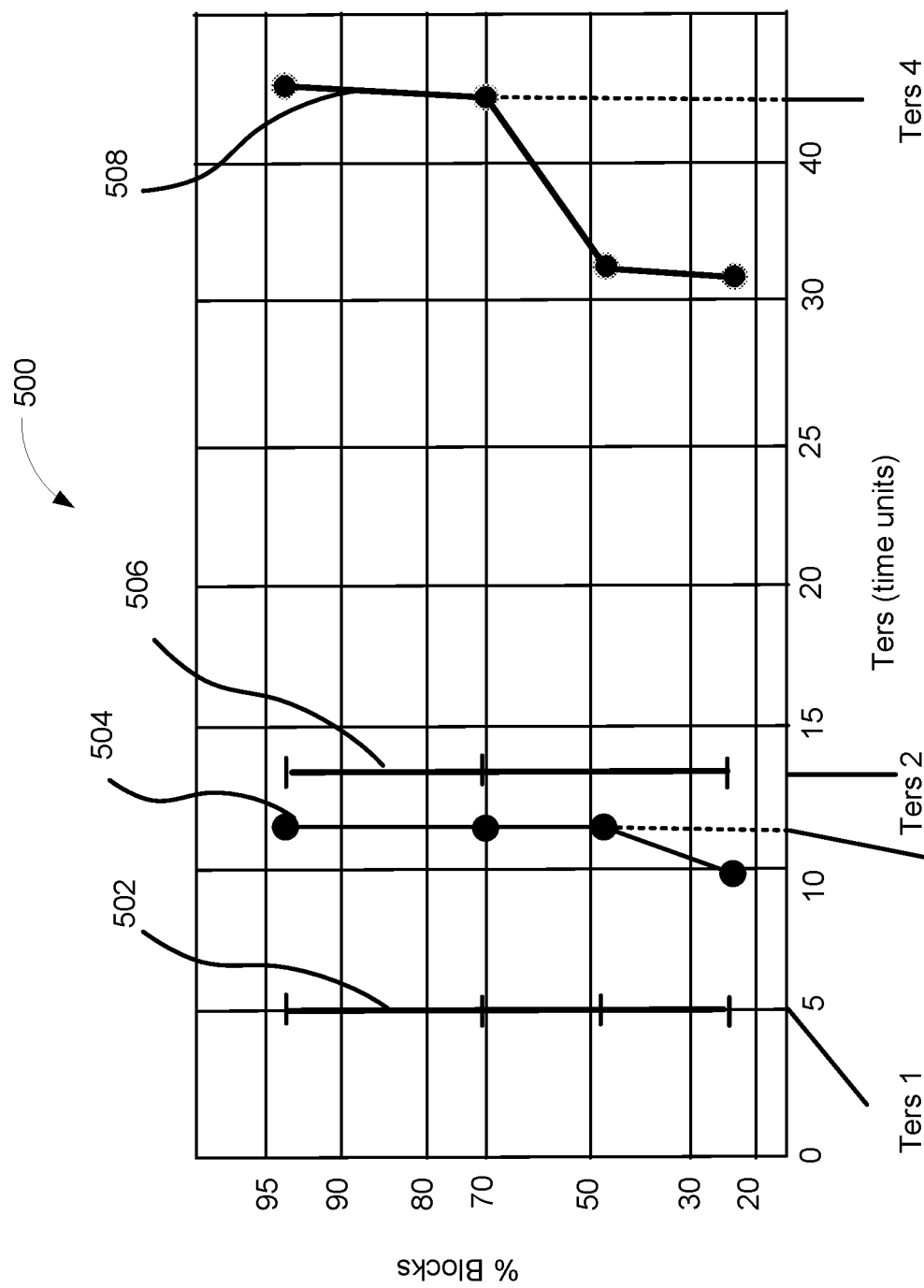
FIG. 5 is an example graph illustrating comparative performance of a sequence of micro-pulses of an erase command and a conventional erase pulse at a beginning and end of a lifecycle of a memory device, in accordance with some embodiments.

FIG. 5 is an example graph illustrating comparative performance of a sequence of micro-pulses of an erase command and a conventional erase pulse at a beginning and end of a lifecycle of a memory device, in accordance with some embodiments. Specifically, graph 500 is a histogram showing a percentage of erased memory blocks in a memory device as a function of a total erase time Ters, at the beginning of a lifecycle of a memory device (pre-cycle) and at the end of the lifecycle of the memory device (post-cycle).

The curves 502 and 504 illustrate the pre-cycle and post-cycle performances of an erase operation using a conventional segment (pulse). The curves 506 and 508 illustrate the pre-cycle and post-cycle performances of an erase operation using a sequence of micro-pulses in accordance with the embodiments described herein. Notably, the pre-cycle performances are quite similar for the conventional solution and the embodiments described herein For example, similar percentages of memory blocks are shown to be erased by the conventional solution at a and by the sequence of micro-pulses according to the present embodiments at similar Ters values Ters 1 and Ters 2. In general, the difference between Ters 1 and Ters 2 is negligible and is within adopted standards In the post-cycle situation, some natural degradation can be observed in comparing the performance of the sequence of micro-pulses to the conventional pulse. In other words, it may take more time to erase the same percentage of memory blocks at the end of the memory lifecycle than at the beginning of the memory lifecycle, for both conventional solution and the embodiments described herein, as indicated by Ters 3 and Ters 4 values for the conventional pulse and sequence of micro-pulses respectively. However, such degradation is deemed to be well within the agreed bounds for a flash memory device.

In the example curves 502 and 506 measured for an example memory device at the beginning of the memory lifecycle and provided in FIG. 5, similar percentages of memory blocks (about 95%) are shown to be erased by the conventional solution at a point Ters 1 of about 5 time units (e.g., milliseconds), and by the sequence of micro-pulses according to the present embodiments at a point Ters 2 of about 13 time units.

In the example curves 504 and 508 measured for the example memory device at the end of the memory lifecycle and provided in FIG. 5, similar percentages of memory blocks (about 95%) are shown to be erased by the conventional pulse at a point Ters 3 of about 13 time units, and by the sequence of micro-pulses according to the present embodiments at a point Ters 4 of about 45 time units. However, as noted above, such degradation is deemed to be well within the agreed bounds for a flash memory device.

In summary, FIG. 5 illustrates the viability of using the micro-pulse sequences in erase operations according to embodiments described herein in a flash memory device.

Figure 6:
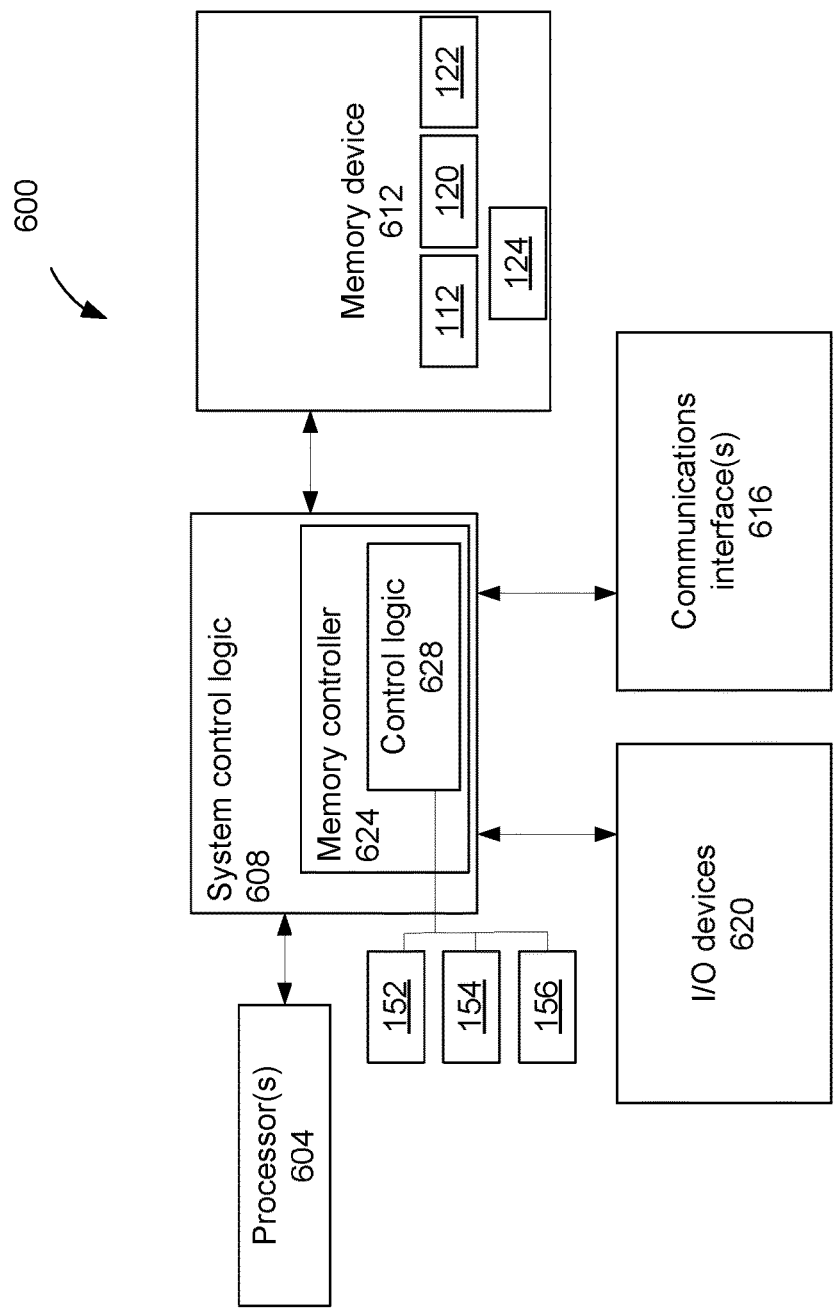
FIG. 6 is an example computing device configured with providing an erase command comprising a sequence of micro-pulses, in accordance with some embodiments.

FIG. 6 is an example computing device configured with providing an erase command comprising a sequence of micro-pulses, in accordance with some embodiments. The computing device 600 includes system control logic 608 coupled to one or more processor(s) 604, a memory device 612, one or more communications interface(s) 616, and input/output (I/O) devices 620.

The memory device 612 may be a non-volatile computer storage chip. In embodiments, the memory device 612 comprises a package, driver circuitry (e.g., drivers), input/output connections to electrically couple the memory device 612 with other components of the computing device 600, etc. The memory device 612 may be configured to be removably or permanently coupled with the computing device 600. In some embodiments, the memory device 612 may be a flash memory device 104 as described in reference to FIG. 1, and include interface 120, control circuit 122, address circuit 124, and memory cell array 112.

Communications interface(s) 616 may provide an interface for computing device 600 to communicate over one or more network(s) and/or with any other suitable device. Communications interface(s) 616 may include any suitable hardware and/or firmware. Communications interface(s) 616 for one embodiment may include, for example, a network adapter, a wireless network adapter, a telephone modem, and/or a wireless modem. For wireless communications, communications interface(s) 616 for one embodiment may use one or more antennas to communicatively couple the computing device 600 with a wireless network.

For one embodiment, at least one of the processor(s) 604 may be packaged together with logic for one or more controller(s) of system control logic 608. For one embodiment, at least one of the processor(s) 604 may be packaged together with logic for one or more controllers of system control logic 608 to form a System in Package (SiP). For one embodiment, at least one of the processor(s) 604 may be integrated on the same die with logic for one or more controller(s) of system control logic 608. For one embodiment, at least one of the processor(s) 604 may be integrated on the same die with logic for one or more controller(s) of system control logic 608 to form a System on Chip (SoC).

System control logic 608 for one embodiment may include any suitable interface controllers to provide for any suitable interface to at least one of the processor(s) 604 and/or to any suitable device or component in communication with system control logic 608. The system control logic 608 may move data into and/or out of the various components of the computing device 600.

System control logic 608 for one embodiment may include a memory controller 624 (similar to 102 of FIG. 1) configured to provide an interface to the memory device 612 (similar to 104 of FIG. 1), to control various memory access operations, including the erase operation as described in reference to FIG. 1. The memory controller 624 may include control logic 628 that may be specifically configured to control access of the memory device 612. In embodiments, the control logic 628 may include the CPU interface 152, memory processor 154, and memory interface 156 described in reference to FIG. 1.

In various embodiments, the I/O devices 620 may include user interfaces designed to enable user interaction with the computing device 600, peripheral component interfaces designed to enable peripheral component interaction with the computing device 600, and/or sensors designed to determine environmental conditions and/or location information related to the computing device 600.

In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard.

In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 616 to communicate with components of a positioning network, e.g., a global positioning system (GPS) satellite.

In various embodiments, the computing device 600 may be a server; a laptop computing device, a tablet computing device, a netbook, a smartphone, etc.; a desktop computing device; a workstation; etc. The computing device 600 may have more or fewer components, and/or different architectures. In further implementations, the computing device 600 may be any other electronic device that processes data.

Figure 7:
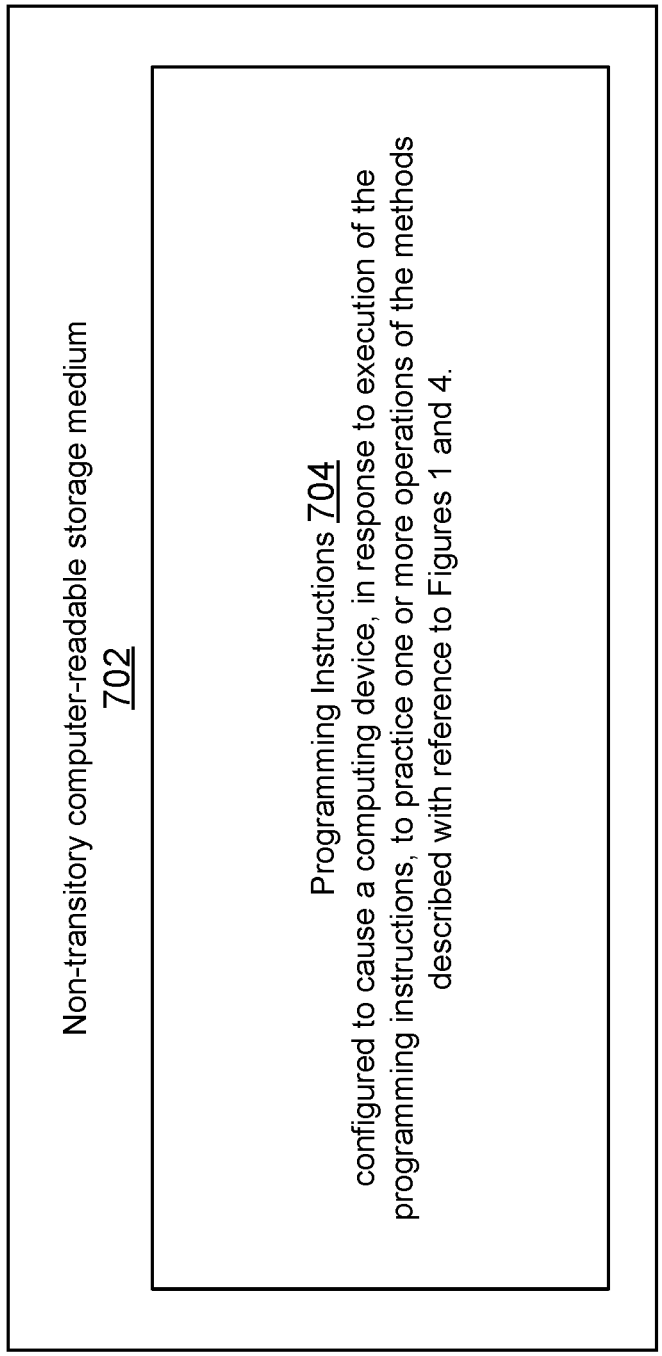
FIG. 7 illustrates an example computing device-readable storage medium having instructions configured to perform some or all operations described in reference to FIGS. 1 and 4, in accordance with some embodiments.

FIG. 7 illustrates an example computing device-readable storage medium having instructions configured to perform some or all operations described in reference to FIGS. 1 and 4, in accordance with some embodiments. More specifically, the instructions may comprise commands to perform operations described in reference to components 102 and 104 of FIG. 1, or instructions provided in blocks 402, 404, 406, and 408 of FIG. 4, for example. The instructions stored on the computing device-readable medium 702 may be executed, for example, on the processor(s) 604 of the computing device 600 of FIG. 6. The computing device-readable storage medium 702 may be implemented in, or be accessible by, the control logic 628 of FIG. 6.

As illustrated, computing device-readable storage medium 702 may include the executable code of a number of programming instructions or bit streams 704. Executable code of programming instructions (or bit streams) 704 may be configured to enable a device, e.g., computing device 600, in response to execution of the executable code/programming instructions to perform (aspects of) processes performed by the memory controller 102 and memory device 104 of FIG. 1. In alternate embodiments, executable code/programming instructions/bit streams 704 may be disposed on multiple non-transitory computing device-readable storage media 702 instead. In embodiments, computing device-readable storage medium 702 may be non-transitory. In still other embodiments, executable code/programming instructions 704 may be encoded in a transitory computer readable medium, such as signals.

According to various embodiments, the present disclosure describes a number of examples.

Example 1 is an memory device, comprising: a host interface, to receive an erase command from a memory controller coupled with the memory device, to erase at least a portion of data stored in the memory device, wherein the erase command comprises a sequence of erase segments that provide an erase voltage to the memory device, wherein the memory controller is to generate the erase command in response to a request provided by a host coupled with the memory controller; and a control circuit coupled with the host interface, to control an execution of the erase command in a memory cell array of the memory device, to erase the requested portion of data.

Example 2 is the memory device of Example 1, wherein the memory device is to grant access to the memory device for servicing at least one of the memory access requests initiated by the host, between at least two adjacent erase segments in the sequence.

Example 3 is the memory device of Example 2, wherein the memory device is to suspend an erase operation associated with the erase command, and grant access to the memory device at a time corresponding to a completion of a first erase segment of the two adjacent erase segments.

Example 4 is the memory device of Example 1, wherein the erase segments in the sequence comprise micro-pulses with the erase voltage.

Example 5 is the memory device of Example 4, wherein the sequence includes eight micro-pulses.

Example 6 is the memory device of Example 5, wherein the erase voltage is about 20 V, and wherein a duration of a micro-pulse in the sequence is about 807 microseconds.

Example 7 is the memory device of Example 1, wherein the memory device comprises a flash memory.

Example 8 is the memory device of Example 7, wherein the memory device is a 3D NAND memory device.

Example 9 is the memory device of any of Examples 1 to 8, wherein the memory controller is integrated with a host processor in a system on chip (SoC).

Example 10 is a computing device, comprising: a host, to initiate memory access requests; a memory device, to store data; and a memory controller coupled with the host and the memory device, wherein the memory controller is to generate an erase command in response a request, provided by the host, to erase at least a portion of the data stored in the memory device, wherein the erase command comprises a sequence of erase segments that provide an erase voltage to the memory device.

Example 11 is the computing device of Example 10, wherein the memory controller is to provide the erase command to the memory device for execution, to erase the requested portion of data.

Example 12 is the computing device of Example 10, wherein the memory controller is to grant access to the memory device for servicing at least one of the memory access requests initiated by the host, between at least two adjacent erase segments in the sequence.

Example 13 is the computing device of Example 12, wherein the memory controller is to suspend an erase operation associated with the erase command, and grant access to the memory device at a time corresponding to a completion of a first erase segment of the two adjacent erase segments.

Example 14 is the computing device of any of Examples 12 to 13, wherein the memory device comprises a flash memory.

Example 15 is a method, comprising: generating, by a memory apparatus of a computing device, an erase command in response to a request, provided by a host of the computing device, to erase at least a portion of data stored in the memory apparatus, including generating a sequence of erase segments that provide an erase voltage for erasing the at least a portion of data stored in the memory apparatus.

Example 16 is the method of Example 15, further comprising: suspending, by the memory apparatus, an erase operation associated with the erase command; and granting, by the memory apparatus, access to memory of the memory apparatus at a time corresponding to a completion of a first erase segment of two adjacent erase segments, to service at least one of memory access requests initiated by the host, between the at least two adjacent erase segments in the sequence, wherein the erase segments in the sequence comprise micro-pulses with the erase voltage.

Example 17 is the method of Example 16, further comprising: performing, by the memory apparatus, a verification of the erase operation, to determine that the portion of data stored in the memory apparatus has been erased.

Example 18 is the method of Example 16, further comprising: verifying, by the memory apparatus, that a total number of erase segments in the sequence equals a predetermined value.

Example 19 is the method of Example 18, wherein the memory apparatus comprises a flash memory.

Example 20 is the method of Example 18, wherein the memory apparatus comprises a NAND memory.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. A memory device, comprising:
a host interface, to receive an erase command from a memory controller coupled with the memory device, to erase at least a portion of data stored in the memory device, wherein the erase command is a single command that comprises a corresponding sequence of erase segments that each provide an erase voltage of a same value to the memory device, wherein the sequence includes at least a first erase segment, a second erase segment adjacent to the first erase segment, and a third erase segment adjacent to the second erase segment, with a first time period between the first and second erase segments, and a second time period between the second and third erase segments, wherein the memory controller is to generate the erase command in response to a request to erase the at least a portion of data provided by a host coupled with the memory controller, wherein the host is to initiate memory access requests to be executed by the memory device; and
a control circuit coupled with the host interface, to control an execution of the erase command in a memory cell array of the memory device, to erase the portion of data;
wherein the memory device is to:
receive, during a duration of the first erase segment, a memory access request; and
in response to the receipt of the memory access request during the duration of the first erase segment,
suspend an erase operation associated with the erase command, and grant access to the memory device at a first time corresponding to a completion of the first erase segment, for the first time period; and
suspend the erase operation associated with the erase command, and grant access to the memory device at a second time corresponding to a completion of the second erase segment, for the second time period,
wherein to erase the portion of the data that is erasable by a conventional erase pulse, the erase command comprises a sequence of eight erase segments, wherein an erase time to erase the portion of the data by the sequence of eight erase segments comprises about half of a time to erase the portion of the data by the conventional erase pulse.

2. The memory device of claim 1, wherein the erase segments in the sequence comprise micro-pulses with the erase voltage.

3. The memory device of claim 2, wherein the erase voltage is about 20 V, and wherein a duration of a micro-pulse in the sequence is about 807 microseconds.

4. The memory device of claim 1, wherein the memory device comprises a flash memory.

5. The memory device of claim 4, wherein the memory device is a 3D NAND memory device.

6. The memory device of claim 4, wherein the memory controller is integrated with a host processor in a system on chip (SoC).

7. A computing device, comprising:
a host, to initiate memory access requests;
a memory device, to store data; and
a memory controller coupled with the host and the memory device, wherein the memory controller is to generate an erase command in response a request, provided by the host, to erase at least a portion of the data stored in the memory device, wherein the erase command comprises a sequence of erase segments that provide an erase voltage to the memory device, wherein the erase command is a single command that comprises a corresponding sequence of erase segments that each provide an erase voltage of a same value to the memory device, wherein the sequence includes at least a first erase segment, a second erase segment adjacent to the first erase segment, and a third erase segment adjacent to the second erase segment, with a first time period between the first and second erase segments, and a second time period between the second and third erase segments,
wherein the memory controller is to:
receive, during a duration of the first erase segment, a memory access request; and
in response to the receipt of the memory access request during the duration of the first erase segment,
suspend an erase operation associated with the erase command, and grant access to the memory device at a first time corresponding to a completion of the first erase segment, for the first time period; and
suspend the erase operation associated with the erase command, and grant access to the memory device at a second time corresponding to a completion of the second erase segment, for the second time period,
wherein to erase the portion of the data that is erasable by a conventional erase pulse, the erase command comprises a sequence of eight erase segments, wherein an erase time to erase the portion of the data by the sequence of eight erase segments comprises about half of a time to erase the portion of the data by the conventional erase pulse.

8. The computing device of claim 7, wherein the memory controller is to provide the erase command to the memory device for execution, to erase the requested portion of data.

9. The computing device of claim 7, wherein the memory device comprises a flash memory.

* * * * *